United States Patent
Sengupta

(12) 
(10) Patent No.: US 6,433,433 B1
(45) Date of Patent: Aug. 13, 2002

(54) SEMICONDUCTOR DEVICE WITH MISALIGNED VIA HOLE

(75) Inventor: Samit Sengupta, San Jose, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/593,322

(22) Filed: Jun. 13, 2000

Related U.S. Application Data

(62) Division of application No. 09/145,017, filed on Sep. 1, 1998, now Pat. No. 6,146,996.

(51) Int. Cl.[7] .......................... H01L 23/48; H01L 23/52
(52) U.S. Cl. ........................ 257/763; 257/774; 257/750
(58) Field of Search ............................. 257/750, 758, 257/774, 763, 764, 765

(56) References Cited

U.S. PATENT DOCUMENTS

| | | | |
|---|---|---|---|
| 5,466,637 A | | 11/1995 | Kim |
| 5,619,072 A | * | 4/1997 | Mehta ........................ 257/774 |
| 5,808,364 A | * | 9/1998 | Cronin et al. ................ 257/758 |
| 6,097,090 A | * | 8/2000 | Tran et al. ................... 257/750 |

OTHER PUBLICATIONS

G.A. Dixit, R.H. Havemann, L. Halliday, J. Strupp, B. Roberts, R.L. Jackson, and E.J. McInerney, "A Robust, Versatile MOCVD TiN Process," Proceedings of the Twelfth Intl. VMIC Conf. (1995), pp. 175–181.

* cited by examiner

*Primary Examiner*—Richard Elms
*Assistant Examiner*—Brad Smith
(74) *Attorney, Agent, or Firm*—Peter Zawilski

(57) ABSTRACT

A semiconductor device includes a semiconductor substrate, e.g., a part of a silicon wafer having an oxide layer disposed thereon. A metal stack is disposed over the semiconductor substrate and a dielectric layer is disposed over the metal stack. The dielectric layer has a via hole formed therein that is misaligned with the metal stack such that a portion of the via hole extends beyond the top of the metal stack and exposes at least a portion of one of the sidewalls of the metal stack. A sidewall cap layer is formed on the exposed portion of the sidewall of the metal stack. The sidewall cap layer is configured to resist substantial penetration of $WF_6$ during chemical vapor deposition of tungsten. The sidewall cap layer may be a nitrided layer or a layer of a dielectric material. A conductive material comprised of tungsten is disposed in and substantially fills the via hole. Methods for making a conductive via in a semiconductor device are also described.

12 Claims, 8 Drawing Sheets

US 6,433,433 B1

SEMICONDUCTOR DEVICE WITH MISALIGNED VIA HOLE

CROSS-REFERENCE TO RELATED APPLICATIONS

This application is a divisional of application Ser. No. 09/145,017, filed Sep. 1, 1998, the disclosure of which is incorporated herein by reference now U.S. Pat. No. 6,146, 996.

BACKGROUND OF THE INVENTION

The present invention relates generally to semiconductor devices and, more particularly, to a semiconductor device with a conductive via and a method of making the same.

Spurred by demand for smaller and faster devices, the semiconductor industry continues to reduce the feature size in integrated circuits (ICs). Interconnect architecture in ICs currently includes metal stacks and spaces less than 0.4 $\mu$m wide. In an IC with a multilevel metallization scheme, the various metal levels are typically connected by conductive vias that are formed by filling via holes with tungsten. One complicating factor in the design of ICs having reduced feature size is that the diameter of the conductive vias must be kept relatively large for two reasons. The first reason is to limit the conductive via resistance, which increases inversely with the square of the diameter of the conductive via. The second reason is to limit the aspect ratio (AR) of the via hole so that an adequate glue layer can be formed on surfaces within the via hole. In the case of a via hole less than 0.25 $\mu$m in diameter, it is difficult to form an adequate glue layer, which is needed to facilitate filling of the via hole with tungsten, if the AR of the via hole exceeds about 3:1.

In some recent IC designs the objective of reducing feature size while keeping the diameter of the conductive vias relatively large has been achieved by tolerating misalignment of the conductive via with one or both of the metal stacks above and below the conductive via. In the case where the conductive via is misaligned with the bottom metal stack, a portion of the conductive via "falls off" the edge of the metal stack and produces a deep recess in the dielectric material adjacent to the sidewall of the metal stack. This deep recess occurs during dry plasma etching of the dielectric to form the via holes because a degree of overetching is required to ensure that all dielectric material is removed from the top of the metal stack and there is no etch stop in the region adjacent to the metal stack. Consequently, the required overetching removes dielectric material in the region adjacent to the metal stack. A conductive via that is misaligned with the bottom metal stack is sometimes referred to as an "unlanded" conductive via and the high aspect ratio region, i.e., the deep recess, adjacent to the sidewall of the metal stack is sometimes referred to as the "unlanded" region.

One problem with unlanded conductive vias is that they expose the sidewall of the metal stack and thereby render the metal stack susceptible to attack during chemical vapor deposition (CVD) of tungsten used to fill the via holes. Attempts have been made to provide a barrier layer that protects the sidewall of the metal stack. For example, in one conventional process flow, after the via holes are etched, a barrier layer, e.g., 50 angstroms to 500 angstroms of Ti/TiN, is first deposited by a standard physical vapor deposition (PVD) or CVD technique and then the via holes are filled with tungsten by CVD. In the case of an unlanded conductive via, such a barrier layer covering the sidewall of the metal stack is effective only if it is continuous and has sufficient thickness and density to resist penetration of $WF_6$, which is the tungsten source gas typically used in the tungsten CVD fill process. If the barrier layer does not resist penetration by $WF_6$, then any exposed metal in the stack that reacts with $WF_6$, e.g., titanium and aluminum, will be attacked thereby causing the formation of a high resistance interface layer that may lead to conductive via failure.

FIG. 1A illustrates at 100 a portion of a semiconductor device in which an unlanded conductive via has caused a sidewall of a metal stack to be attacked during the tungsten CVD fill process. As shown in FIG. 1A, semiconductor substrate 102 has dielectric layer 104 disposed thereover. Metal stacks 106 are disposed on a first level over dielectric layer 104. Dielectric layer 108 disposed over metal stacks 106 has conductive vias 110 formed therein. Metal stacks 112a and 112b are disposed on a second level over dielectric layer 108. Conductive vias electrically connect metal stacks 106 and 112a. As shown in FIG. 1A, conductive vias 110 are misaligned with respect to metal stacks 106 and therefore constitute unlanded conductive vias, as discussed above. Conductive vias 110 are also misaligned with respect to metal stacks 112a.

FIG. 1B shows an enlarged view of region 114 indicated by the dashed circle in FIG. 1A. As shown in FIG. 1B, metal stack 106 includes layers 116, 118, 120, and 122. A wetting layer 116 formed of, e.g., Ti or TiN, is disposed over dielectric layer 104. Aluminum layer 118 is disposed over barrier layer 116. Titanium layer 120 is disposed over aluminum layer 118. Titanium nitride layer 122 is disposed over titanium layer 120. Contaminated regions 124 in titanium layer 120 are produced when $WF_6$ attacks the sidewall of layer 120, which is adjacent to the unlanded region of conductive via 110. The reaction between $WF_6$ and titanium produces a number of reaction products including $TiF_3$, $TiF_4$, and certain tungsten-containing materials. The production of $TiF_3$, which is a gas, consumes solid titanium and thereby causes voids to be formed in titanium layer 120 as $WF_6$ advances into layer 120. The production of $TiF_3$ is further problematic because any such gas trapped within titanium layer 120 generates stress that may lead to delamination of titanium nitride layer 122. The production of $TiF_4$, or other fluorine- or tungsten-containing compounds having high resistance, creates a high resistance interface layer that may cause conductive via failure. Although not indicated as such in FIG. 1B for the sake of clarity, any exposed portion of the sidewall of aluminum layer 118 also may be attacked by $WF_6$. The degree to which aluminum layer 118 is attacked is less than that of titanium layer 120; however, due to the relatively lower reactivity of aluminum with $WF_6$.

To date, barrier layers formed by standard PVD techniques have not been effective to protect the sidewall of a metal stack from being attacked during the tungsten CVD fill process. A barrier layer of TiN formed by CVD provides adequate step coverage in the unlanded region; however, this approach presents significant reliability issues because of particle contamination and the poor TiN film properties produced by the CVD process. Another approach involves deposition of a TiN barrier layer by metalorganic chemical vapor deposition (MOCVD) followed by $N_2/H_2$ plasma treatment. This MOCVD approach is undesirable because the subsequent plasma treatment does not burn off all the organic components, particularly at the sidewalls of the via hole and in the unlanded region, which results in the barrier layer being too weak in those areas to resist penetration by $WF_6$. Yet another approach involves deposition of a TiN barrier layer by an ionized sputter (PVD) technique, e.g., ionized metal plasma (IMP). This approach does not protect the sidewall of the metal stack because little or no deposition of IMP TiN occurs in the unlanded region. As such, the exposed portion of the sidewall of the metal stack, which contains free titanium, remains exposed after deposition of the barrier layer and, consequently, can be easily attacked by $WF_6$.

Protection of the sidewalls of a metal stack is also a concern in so-called self-aligned vias in which silicon nitride spacers cover the sidewalls of the metal stack. For example, the via etch can etch through the spacers if adequate selectivity of the oxide etch to silicon nitride is not maintained. The spacers also can be attacked when exposed to solvents during post-etch stripping. As such, the presence of such silicon nitride spacers does not ensure that the sidewalls of a metal stack are adequately protected from being attacked during the tungsten CVD fill process. Furthermore, the presence of silicon nitride spacers, which are relatively thick, between metal stacks is undesirable because silicon nitride has a relatively high dielectric constant and therefore slows down interconnect speed.

In view of the foregoing, there is a need for a reliable method of protecting the sidewall of a metal stack from being attacked by $WF_6$ during the tungsten CVD fill process used in the production of unlanded conductive vias.

SUMMARY OF THE INVENTION

Broadly speaking, the present invention fills this need by providing a sidewall cap layer that protects the sidewall of a metal stack from being attacked by $WF_6$ during a tungsten CVD fill process. The sidewall cap layer may be a nitrided layer or a layer of dielectric material. The sidewall cap layer may be formed using various methods, as described in detail below.

In accordance with one aspect of the present invention, a first method of making a conductive via in a semiconductor device is provided. In this method a semiconductor substrate having a metal stack and a dielectric layer formed thereover is first provided. The dielectric layer covers the metal stack, which includes a conductive layer of, e.g., aluminum or an aluminum-copper alloy, and a layer containing free titanium formed over the conductive layer. A via hole is then formed in the dielectric layer. The via hole is misaligned over the metal stack such that at least a portion of the top and at least a portion of the sidewall of the metal stack are exposed. The exposed portion of the sidewall of the metal stack includes the free titanium-containing layer and at least a portion of the conductive layer. Next, the exposed portion of the sidewall of the metal stack is subjected to a nitrogen plasma to form a nitrided sidewall cap layer, which preferably includes a layer of titanium nitride and a layer of aluminum nitride. Finally, the via hole is filled with a conductive material, e.g., tungsten, to form a conductive via.

In one embodiment, the nitrogen plasma is struck in a plasma-enhanced chemical vapor deposition (PECVD) chamber. The titanium nitride layer preferably has a thickness in range from about 10 angstroms to about 200 angstroms, and more preferably in a range from about 30 angstroms to about 100 angstroms. The aluminum nitride layer preferably has a thickness in the range from about 20 angstroms to about 100 angstroms.

In accordance with another aspect of the present invention, a second method of making a conductive via in a semiconductor device is provided. This second method is essentially the same as the first method described above except for the manner in which the nitrided sidewall cap layer is formed. In this second method, the exposed portion of the sidewall of the metal stack is annealed in the presence of a forming gas containing nitrogen to form the nitrided sidewall cap layer. The annealing is preferably conducted in a tube furnace at a temperature of about 400° C. for about 15 minutes to about 2 hours. The forming gas preferably contains about 95% by volume of $N_2$ and about 5% by volume of $H_2$.

In accordance with yet another aspect of the present invention, a third method of making a conductive via in a semiconductor device is provided. In this third method, after the via hole is formed, a layer of dielectric material is deposited on exposed surfaces within the via hole such that the exposed surfaces are substantially conformally coated with dielectric material. Thereafter, the portion of the layer of dielectric material covering the top of the metal stack is selectively removed while leaving the portion covering the exposed portion of the sidewall of the metal stack substantially intact to define the sidewall cap layer.

By way of example, the layer of dielectric material may be formed of silicon nitride, silicon dioxide, amorphous carbon, polymers, hydrogen silsesquioxane (HSQ), or methyl silsesquioxane (MSQ). In one preferred embodiment, the dielectric layer is comprised of silicon nitride and has a thickness in a range from about 50 angstroms to about 300 angstroms. In this preferred embodiment, the dielectric layer is selectively removed by sputter etching which is controlled to prevent significant etching of the portion of the dielectric material covering the exposed portion of the sidewall of the metal stack.

In accordance with a further aspect of the present invention, a semiconductor device is provided. This semiconductor device includes a semiconductor substrate, e.g., a part of a silicon wafer having an oxide layer disposed thereon. A metal stack is disposed over the semiconductor substrate and a dielectric layer is disposed over the metal stack. The dielectric layer has a via hole formed therein that is misaligned with the metal stack such that a portion of the via hole extends beyond the top of the metal stack and exposes at least a portion of one of the sidewalls of the metal stack. A sidewall cap layer is formed on the exposed portion of the metal stack. This sidewall cap layer is configured to resist substantial penetration of $WF_6$ during chemical vapor deposition of tungsten. A conductive material comprised of tungsten is disposed in and substantially fills the via hole.

The metal stack preferably includes a conductive layer comprised of aluminum, a layer comprised of titanium disposed over the conductive layer, and a layer comprised of titanium nitride disposed over the titanium layer. In one embodiment, the sidewall cap layer is a nitrided sidewall cap layer that includes a layer of titanium nitride and a layer of aluminum nitride. In another embodiment, the sidewall cap layer is a layer of a dielectric material such as silicon nitride, silicon dioxide, amorphous carbon, a polymeric material, hydrogen silsesquioxane (HSQ), or methyl silsesquioxane (MSQ).

The present invention provides a sidewall cap layer that protects the exposed sidewall adjacent to the unlanded region of a via hole during CVD of tungsten by resisting substantial penetration of $WF_6$. The sidewall cap layer of the present invention may be kept relatively thin, which is desirable for fast interconnect speed, because it is formed after the via holes have been etched. Thus, in contrast with self-aligned vias, the sidewall cap layer of the present invention is not subject to attack during via etching due to insufficient etch selectivity or attack by solvents during pos-tetch stripping.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Figure 1A:
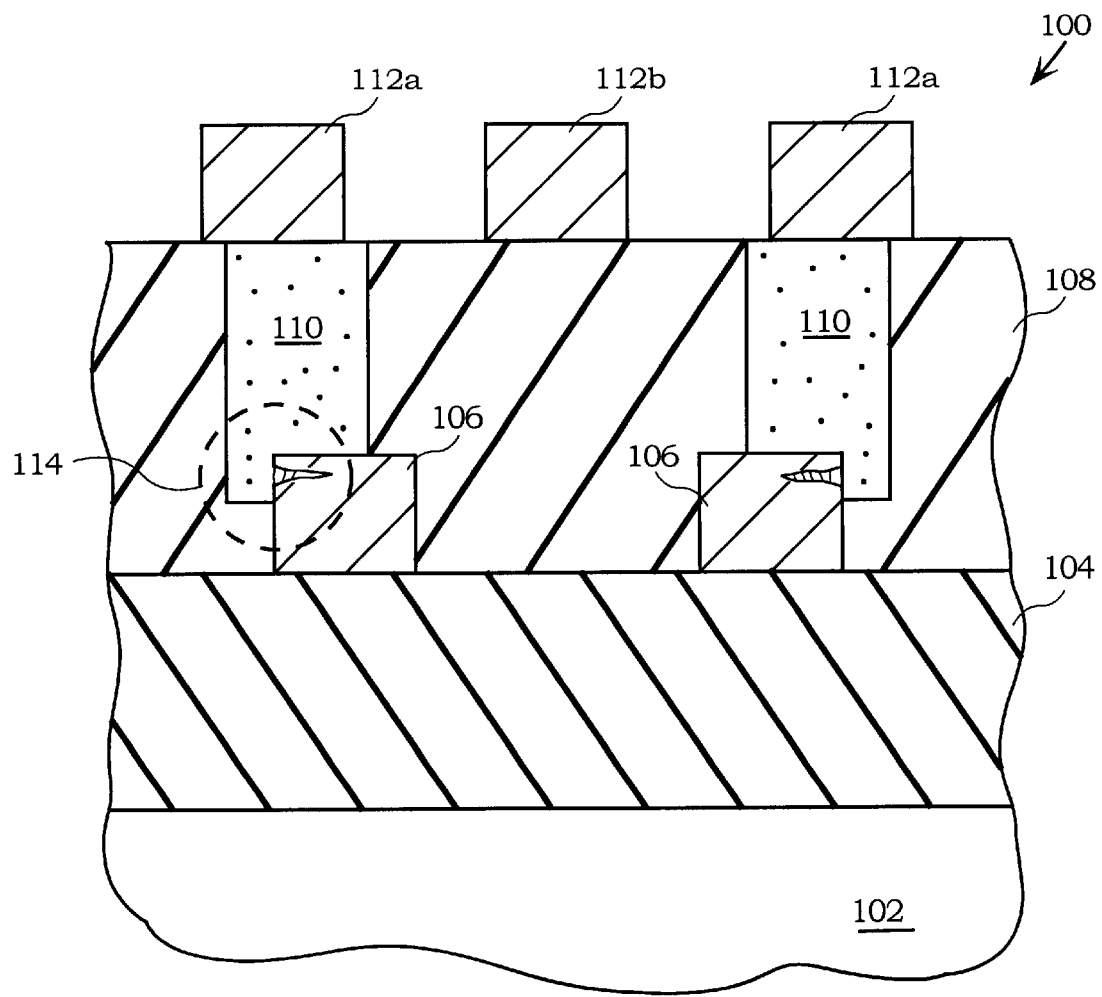
FIG. 1A shows a cross-sectional view of an unlanded conductive via in which the bottom metal stack has been attacked by $WF_6$ during the tungsten CVD fill process.
Figure 1B:
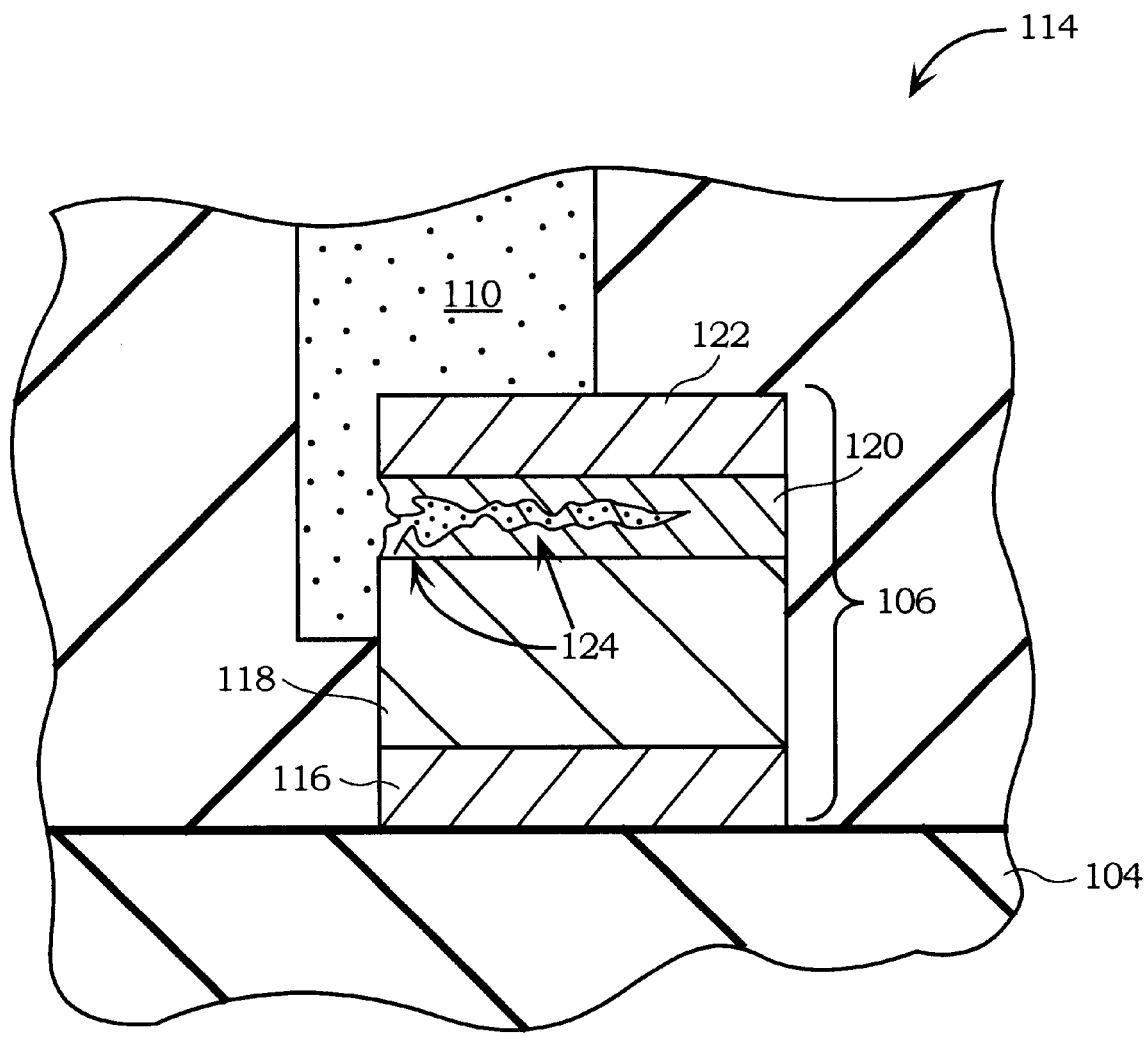
FIG. 1B is an enlarged view of region 114 indicated by the dashed circle in FIG. 1A.

The present preferred embodiments of the invention will now be described in detail with reference to the accompanying drawings. FIGS. 1A and 1B are discussed above in the "Background of the Invention" section.

Figure 2A:
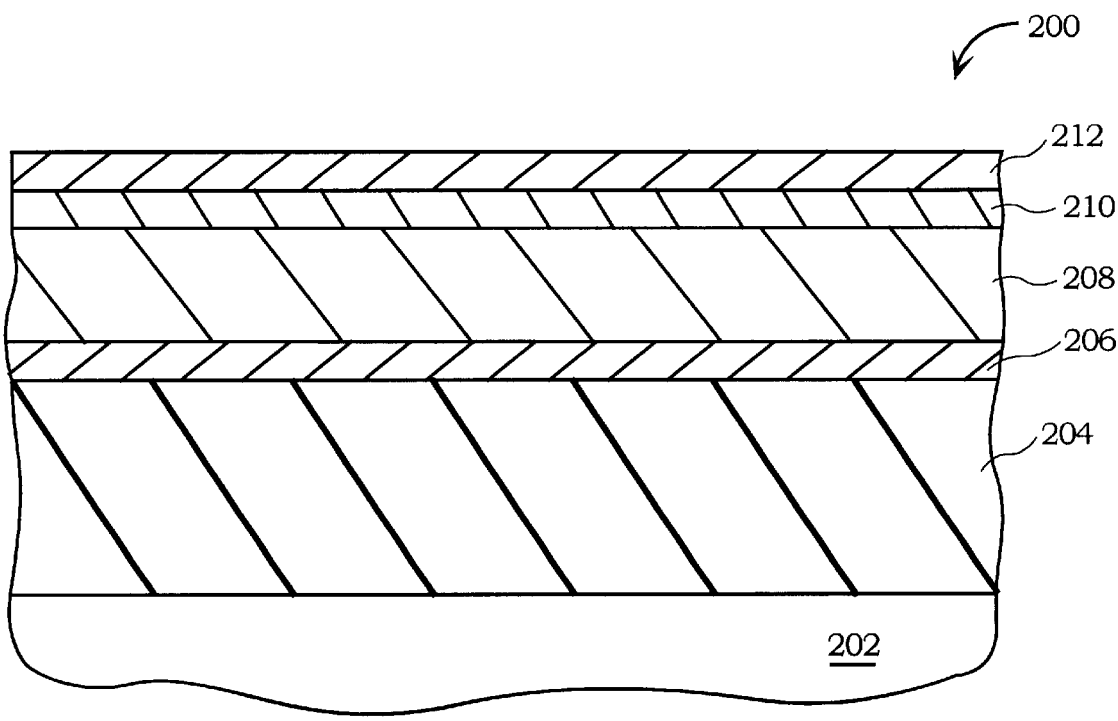
FIG. 2A shows a cross-sectional view of a semiconductor substrate having an oxide layer and various metal layers disposed thereover before patterning and etching of the metal layers to define a metal stack.
Figure 2B:
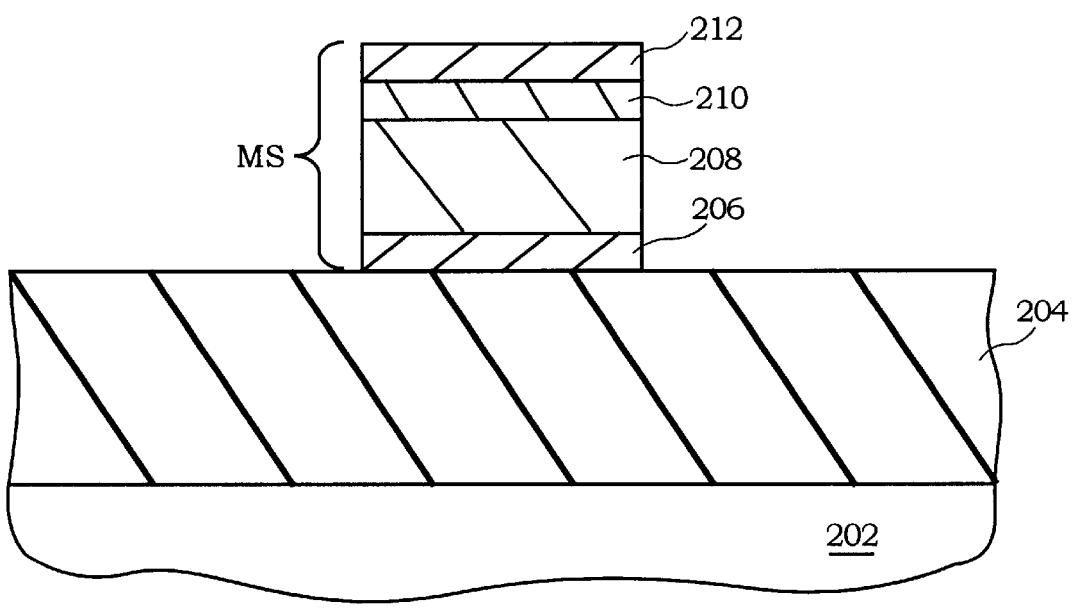
FIG. 2B shows a cross-sectional view of the structure shown in FIG. 2A after the metal layers have been patterned and etched to define a metal stack.

FIGS. 2A and 2B illustrate the well-known processes used to form a metal stack, which serves as a conductor to electrically connect components in an IC device. FIG. 2A shows at 200 a semiconductor substrate 202 having layers 204, 206, 208, 210, and 212 disposed thereover, the details of which are set forth below. As shown herein, semiconductor substrate 202 is a portion of a silicon wafer. Those skilled in the art will recognize that other semiconductor materials, e.g., Ge and GaAs, also may be used and that the substrate need not be in the form of a wafer or a portion of a wafer.

A layer of dielectric material 204 is disposed over semiconductor substrate 202. Dielectric layer 204 is preferably silicon dioxide deposited by known techniques, e.g., CVD. A wetting layer 206 is disposed over dielectric layer 204. Wetting layer 206 is preferably titanium or titanium nitride deposited by known techniques, e.g., PVD. A conductive layer 208 is disposed over wetting layer 206. Conductive layer 208 is preferably comprised of aluminum, however, other highly conductive materials, e.g., aluminum-copper alloys, also may be used. Conductive layer 208 may be deposited by sputtered PVD and preferably has a thickness of about 2,000 angstroms to about 10,000 angstroms, and more preferably about 5,000 angstroms. A layer of titanium 210 is disposed over conductive layer 208. Titanium layer 210 may be deposited by sputtered PVD and preferably has a thickness of about 30 angstroms to about 300 angstroms. A layer of titanium nitride 212 is disposed over titanium layer 210. Titanium nitride layer 212 may be deposited by sputtered PVD and preferably has a thickness of about 200 angstroms to about 1,500 angstroms.

FIG. 2B illustrates the structure that results after layers 206, 208, 210, and 212 shown in FIG. 2A are patterned and etched to define a metal stack (MS). As used in connection with the description of the invention, the term "metal stack" refers to a conductive structure including one or more layers containing a highly conductive material, e.g., aluminum. In metal stack MS conductive layer 208 is the primary conductive layer. The combination of titanium layer 210 and titanium nitride layer 212 forms a titanium/titanium nitride antireflective layer. Those skilled in the art are familiar with the patterning and etching processes required to define metal stack MS. In so-called 0.25 $\mu$m technology IC devices, the width of metal stack MS is typically not less than 0.4 $\mu$m.

Figure 2C:
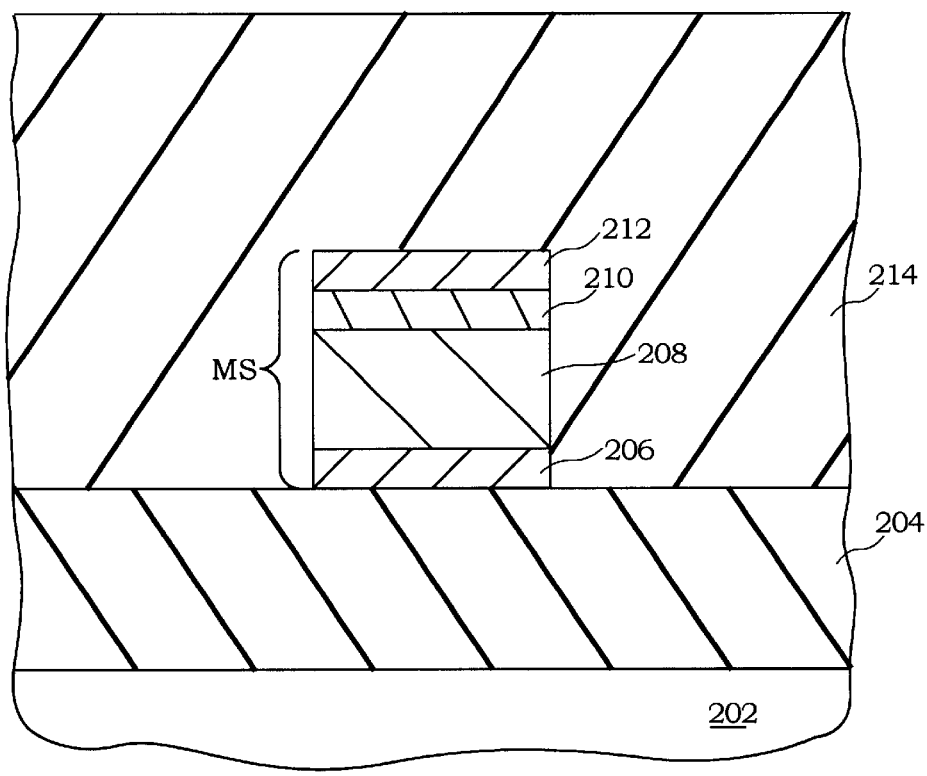
FIG. 2C shows a cross-sectional view of the structure shown in FIG. 2B after a dielectric layer has been deposited and over the metal stack and top planarized.
Figure 2D:
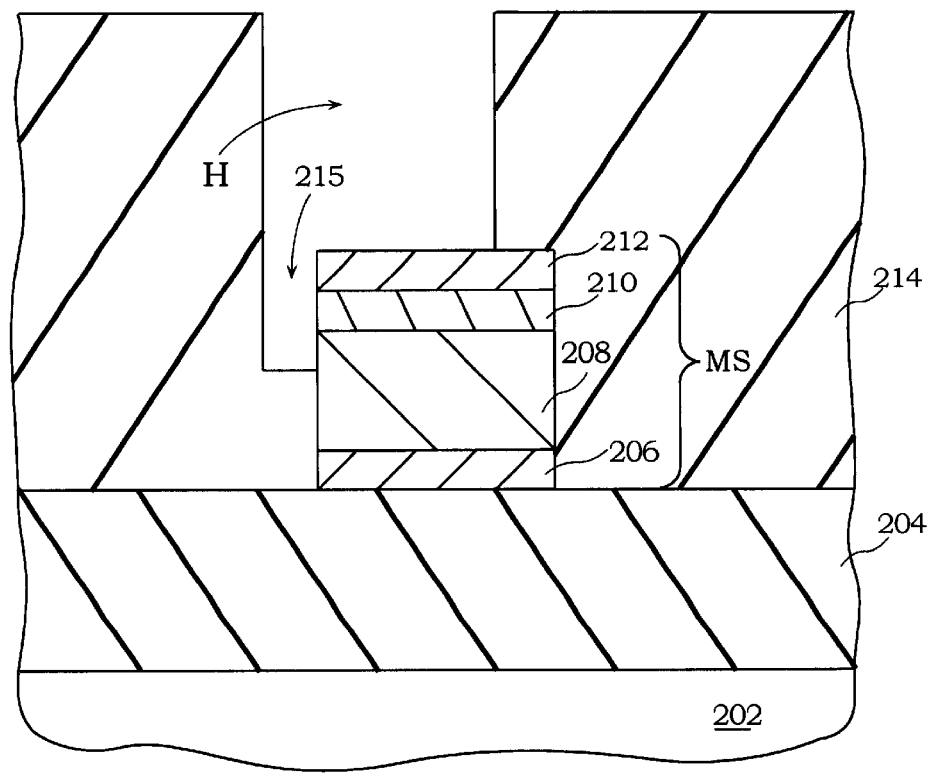
FIG. 2D shows a cross-sectional view of the structure shown in FIG. 2C after the dielectric layer has been patterned and etched to form a via hole over the metal stack, where the via hole is misaligned with the metal stack.

FIGS. 2C and 2D illustrate the well-known processes used to form a via hole over metal stack MS as shown in FIG. 2B. With reference to FIG. 2C, a layer of dielectric material 214 is disposed over metal stack MS and dielectric layer 204. As shown in FIG. 2C, dielectric layer 214 has been top planarized by known techniques, e.g., chemical mechanical polishing or an etchback technique. Dielectric layer 214 is preferably silicon dioxide deposited by known techniques, e.g., CVD. After patterning, dielectric layer 214 is etched to define via hole H as shown in FIG. 2D. One suitable technique for etching dielectric layer 214 to define via hole H is dry plasma etching. After dry plasma etching, the exposed surfaces within via hole H are subjected to stripping and cleaning processes, as is known to those skilled in the art.

As described above, a degree of overetching, e.g., about 30% to about 50%, of dielectric layer 214 is typically required to ensure that all the dielectric material is removed from the top surface of metal stack MS, i.e., the top surface of titanium nitride layer 212. As shown in FIG. 2D, via hole H in dielectric layer 214 includes unlanded region 215, which exposes a portion of the sidewall of metal stack MS. As also described above, unlanded region 215 occurs because via hole H is misaligned with metal stack MS and there is no etch stop in the region adjacent to the metal stack to prevent continued etching of the dielectric material in this region during overetching. In so-called 0.25 $\mu$m technology IC devices, the width of via hole H at points above the top surface of metal stack MS is generally not less than about 0.3 $\mu$m, and typically is about 0.35 $\mu$m. Further, in such IC devices, up to about 0.1 μm of misalignment between via hole H and metal stack MS is tolerated. Consequently, the width of unlanded region 215 generally does not exceed about 0.1 μm, and typically is below 0.07 μm. The unlanded region 215 increases the effective aspect ratio (AR) of via hole H.

In accordance with one aspect of the invention, the exposed portion of the sidewall of the metal stack is subjected to a nitrogen plasma to form a nitrided sidewall cap layer, which protects the sidewall from $WF_6$ attack. In one embodiment this is accomplished by placing the semiconductor substrate in a plasma-enhanced chemical vapor deposition (PECVD) chamber and striking a plasma therein. The PECVD chamber is preferably operated under conditions in which an $N_2$-containing gas is flowed into the chamber and no deposition occurs. The flow rate of the $N_2$-containing gas is preferably about 15 sccm to about 150 sccm. The operating pressure in the PECVD chamber may be about $10^{-6}$ Torr up to about $10^2$ Torr, with a preferred pressure being about 10 Torr. The RF power is preferably about 100 watts to about 2,000 watts, more preferably about 200 watts to about 600 watts, and most preferably about 400 watts. The temperature of the pedestal on which the semiconductor substrate is mounted, e.g., an electrostatic chuck, may be about 100° C. to about 450° C., with a preferred temperature being about 350° C.

Figure 3A:
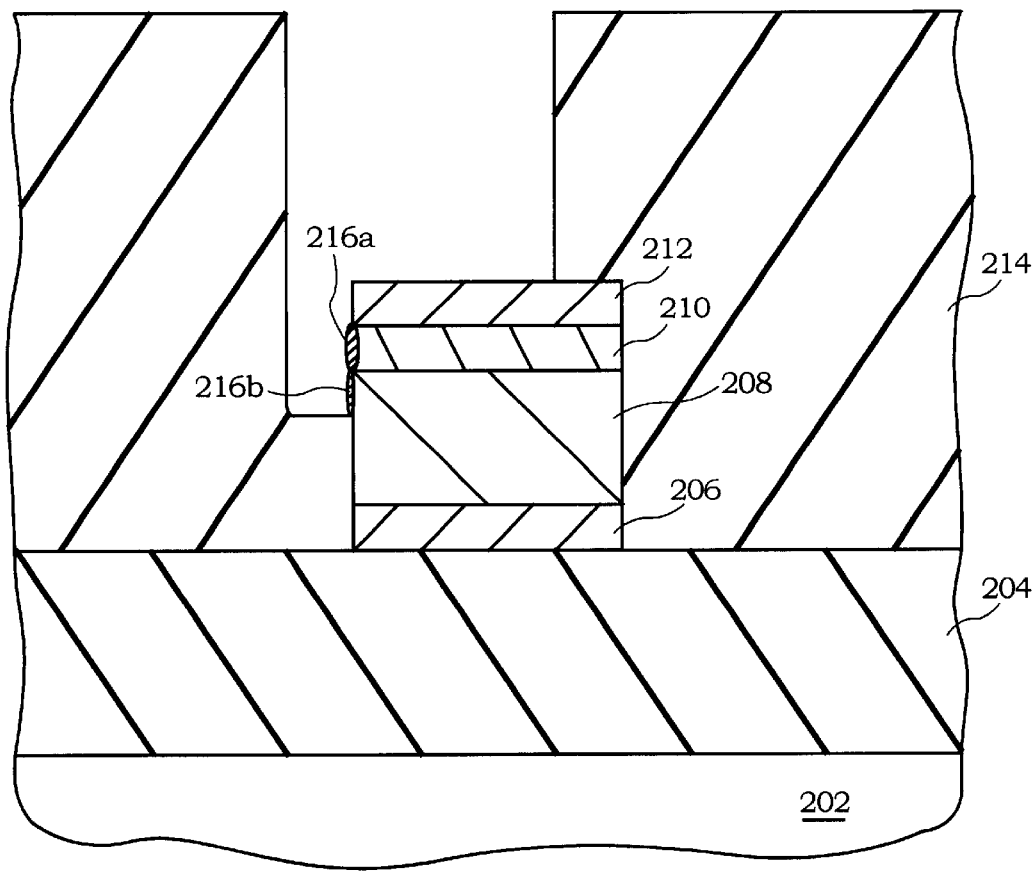
FIG. 3A is a cross-sectional view of the structure shown in FIG. 2D after the exposed sidewall of the metal stack has been subjected to a nitrogen plasma to form a nitrided sidewall cap layer in accordance with one embodiment of the present invention.
Figure 3B:
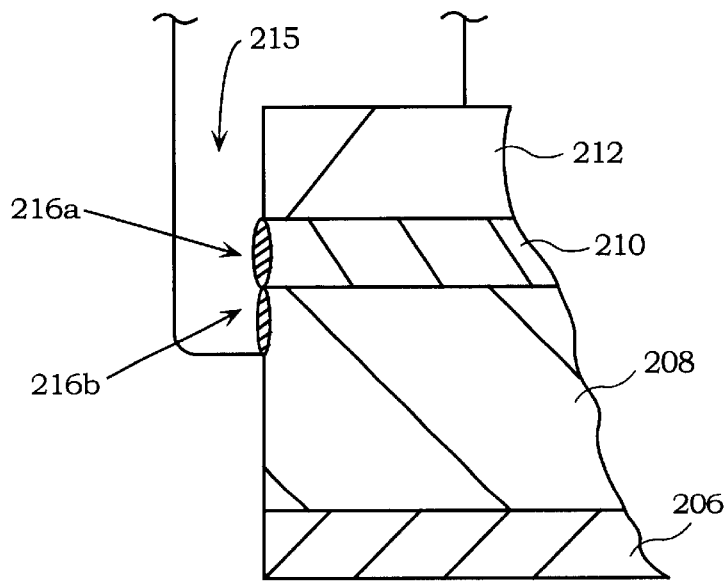
FIG. 3B is an enlarged view of the nitrided sidewall cap layer shown in FIG. 3A.

Referring to FIGS. 3A and 3B, the nitrogen species in the plasma reacts with the exposed portions of titanium layer 210 and conductive layer 208 to form nitrided sidewall cap layer 216, which includes portions 216a and 216b. Portion 216a is a thin layer comprised of titanium nitride and portion 216b is a thin layer comprised of aluminum nitride. The thickness of titanium nitride portion 216a of nitrided sidewall cap layer 216 is preferably in a range from about 20 angstroms to about 200 angstroms, more preferably from about 30 angstroms to about 100 angstroms, and most preferably about 50 angstroms. The thickness of aluminum nitride portion 216b of nitrided sidewall cap layer 216 is preferably in a range from about 20 angstroms to about 100 angstroms, and most preferably about 40 angstroms. Those skilled in the art will appreciate that more efficient nitridation of titanium layer 210 and conductive layer 208 may be obtained by accelerating the nitrogen ions in the plasma toward the sidewall of the metal stack under an RF bias or an external wafer bias.

In another embodiment the exposed portion of the sidewall of the metal stack is subjected to a nitrogen plasma by placing the semiconductor substrate in a PVD chamber and striking a plasma therein. The flow rate of $N_2$ gas may be about 15 sccm to about 100 sccm, with a preferred flow rate being about 50 sccm. The operating pressure in the PVD chamber is preferably about $10^{-3}$ Torr. The RF power may be about 50 watts to about 500 watts, with a preferred RF power being about 200 watts. For efficient thermal nitridation, the semiconductor substrate may be placed on a heated pedestal, preferably equipped with an electrostatic chuck, at about 350° C.

Figure 3C:
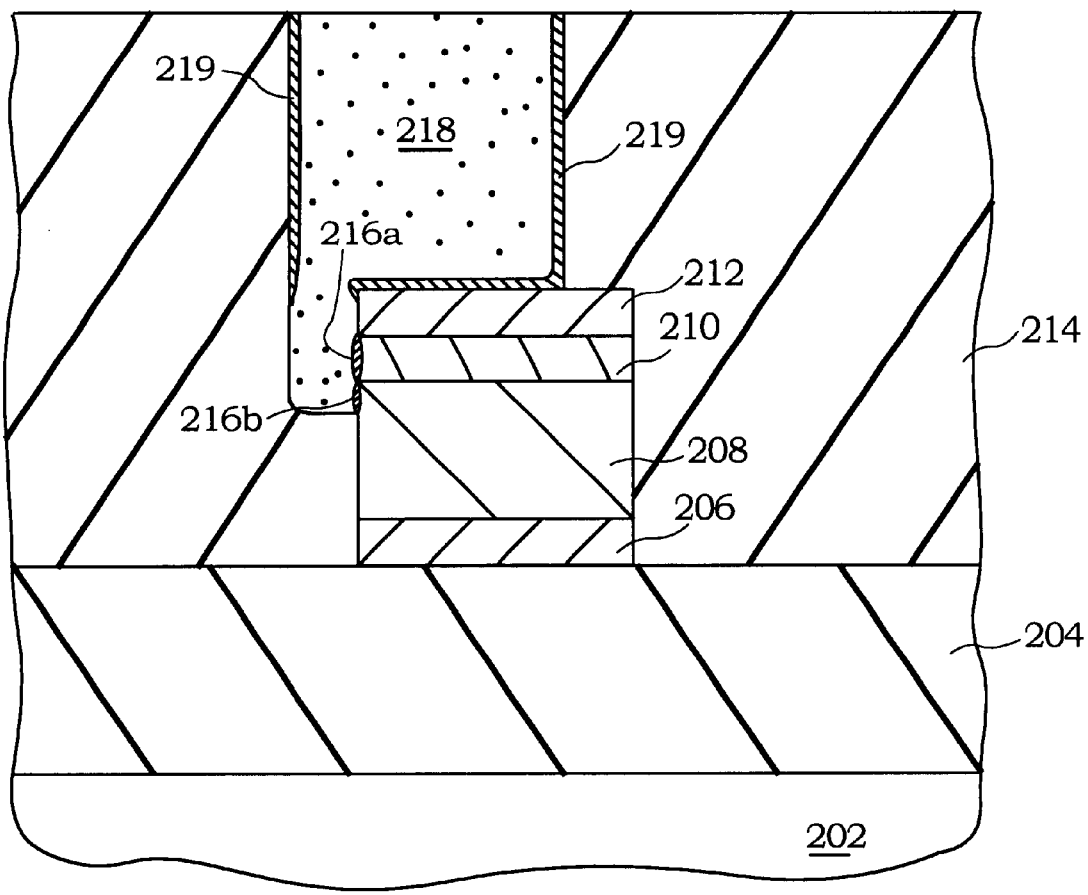
FIG. 3C is a cross-sectional view of the structure shown in FIG. 3A after the via hole has been filled with a conductive material to form a conductive via.

After the formation of the nitrided sidewall cap layer, the via hole is filled with a conductive material to form a conductive via. FIG. 3C shows the structure of FIG. 3A after via hole H has been filled with a conductive material. As shown in FIG. 3C, conductive material 218, e.g., tungsten, is disposed over metal stack MS. Conductive material 218 may be deposited in accordance with known techniques, e.g., CVD. As is well known to those skilled in the art, a glue layer 219 of, e.g., Ti/TiN, is first deposited by, e.g., PVD, because tungsten CVD does not adhere well to dielectric layer 214, which is typically silicon dioxide. As shown in FIG. 3C, glue layer 219 does not fully cover the exposed surfaces within unlanded region 215 (see FIG. 3B). As described above, in standard tungsten CVD fill processes $WF_6$ is used as the tungsten source gas. During the tungsten CVD fill process, nitrided sidewall cap layer 216 resists substantial penetration of $WF_6$ and thereby protects the sidewalls of titanium layer 210 and conductive layer 208 from being attacked by $WF_6$.

In accordance with another aspect of the invention, the exposed portion of the sidewall of the metal stack is annealed in the presence of a forming gas containing nitrogen to form the nitrided sidewall cap layer. This may be accomplished by placing the semiconductor substrate in a tube furnace at a temperature of about 400° C. for about 15 minutes to about 2 hours, with an annealing time of about 30 minutes to about 45 minutes being preferred. One suitable forming gas contains about 95% by volume of $N_2$ and about 5% by volume of $H_2$. For this forming gas, the preferred flow rates for $N_2$ and $H_2$ are about 1,200 sccm and about 75 sccm, respectively.

The nitrided sidewall cap layer formed by annealing is substantially the same as the nitrided sidewall cap layer formed using nitrogen plasma (see nitrided sidewall cap layer 216 in FIG. 3A), with the exception that the layer formed by annealing may not be as dense as the layer formed using nitrogen plasma. In some applications the annealing technique may be preferable to the plasma technique because it is simpler and avoids plasma damage. In other applications the plasma technique may be preferable to the annealing technique because it is quicker and produces a denser nitrided sidewall cap layer.

Figure 4A:
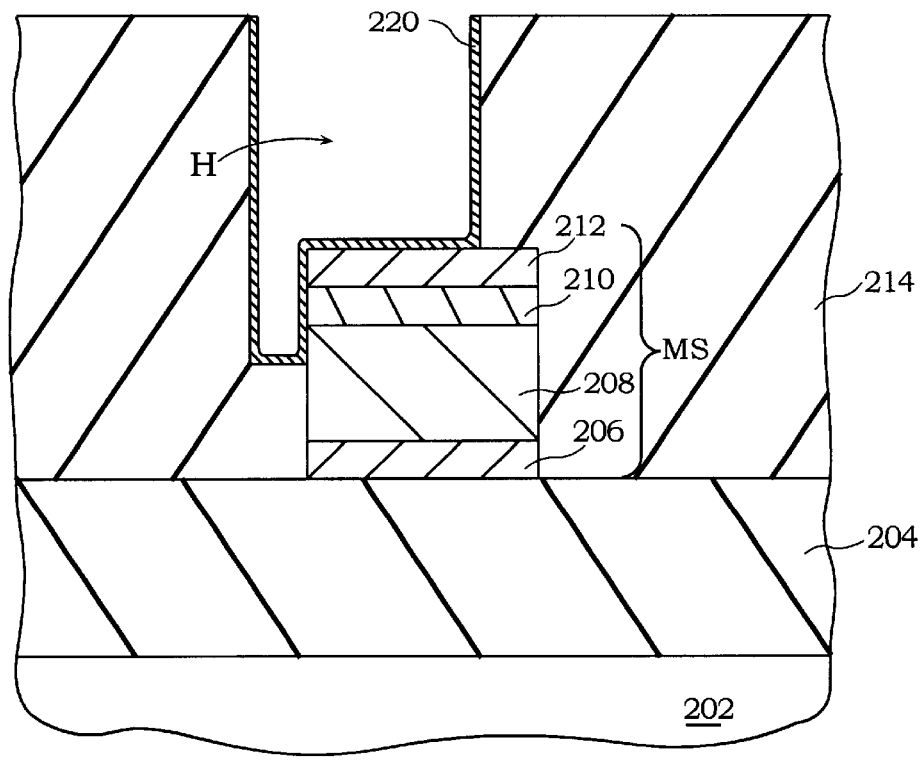
FIG. 4A shows a cross-sectional view of the structure shown in FIG. 2D after a layer of dielectric material has been formed on exposed surfaces within the via hole.

In accordance with a further aspect of the invention, the sidewall cap layer is formed by depositing a layer of dielectric material on exposed surfaces within the via hole, and selectively removing the dielectric layer from the top of the metal stack while leaving the portion of the dielectric layer covering the sidewall of the metal stack substantially intact. FIG. 4A shows the structure of FIG. 2D after a layer of dielectric material 220 has been deposited on the exposed surfaces within via hole H. As shown in FIG. 4A, the layer of dielectric material 220 is comprised of silicon nitride. As used in connection with the description of the invention, the term "silicon nitride" refers to the composition $Si_3N_4$ and nonstoichiometric variations thereof. As shown in FIG. 4A, silicon nitride layer 220 substantially conformally coats the exposed surfaces within via hole H, including the sidewalls and bottom of via hole H and the sidewall and top of metal stack MS. Silicon nitride layer 220 preferably has a thickness in a range from about 50 angstroms to about 300 angstroms.

In one embodiment silicon nitride layer 220 is deposited by PECVD using silane ($SiH_4$) as the silicon source gas, ammonia ($NH_3$) as the nitrogen source gas, and $N_2$ as the carrier gas. Those skilled in the art will recognize that other source and carrier gases may be used. The flow rates of silane and ammonia are preferably about 20 sccm to about 120 sccm, more preferably about 50 sccm to about 100 sccm, and most preferably about 80 sccm. The flow rate of $N_2$ gas is preferably about 1,000 sccm to about 5,000 sccm, more preferably about 2,000 to about 4,000 sccm, and most preferably about 3,000 sccm. The pressure in the PECVD chamber may be in a range from about 3 Torr to about 6 Torr, with a preferred pressure being about 5.5 Torr. The temperature of the pedestal on which the semiconductor substrate is mounted, e.g., an electrostatic chuck, is preferably about 250° C. to about 600° C., more preferably about 300° C. to about 550° C., and most preferably about 480° C.

Figure 4B:
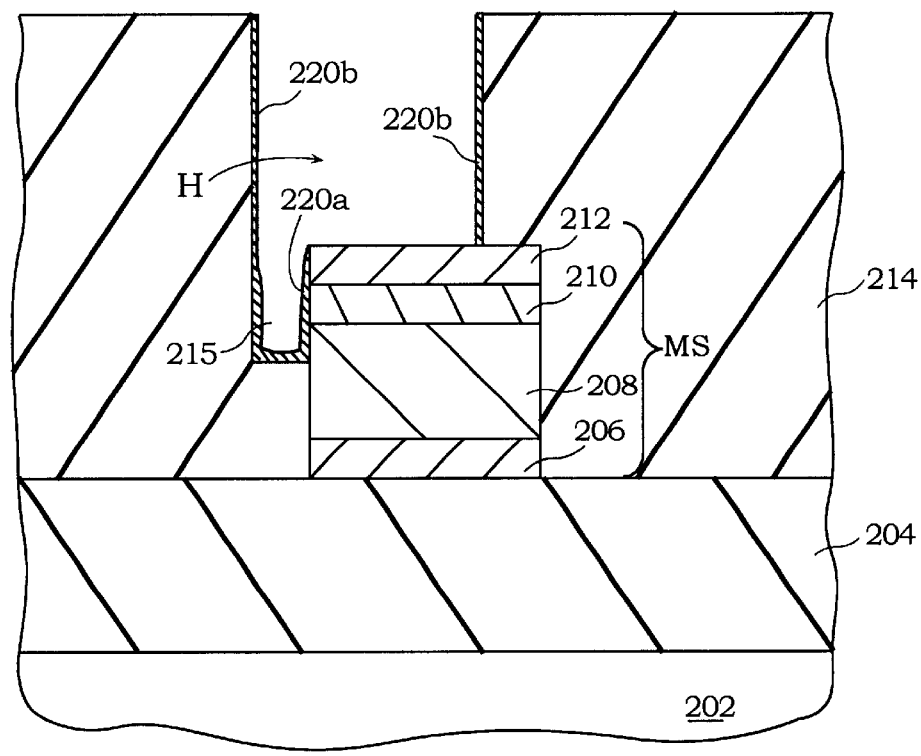
FIG. 4B shows a cross-sectional view of the structure shown in FIG. 4A after portions of the dielectric layer formed on exposed surfaces within the via hole have been selectively removed to define a sidewall cap layer in accordance with another embodiment of the present invention.

FIG. 4B shows the structure of FIG. 4A after the portion of silicon nitride layer 220 covering the top of metal stack MS has been selectively removed. The selective removal process is configured to leave the portion of silicon nitride layer 220a that covers the sidewall of metal stack MS substantially intact and thereby defines the sidewall cap layer in accordance with this aspect of the invention. As shown in FIG. 4B, thinned portions of silicon nitride layer 220b that cover the sidewalls of via hole H also remain after the selective removal process, as described in more detail below.

In one embodiment silicon nitride layer 220 is selectively removed by dual RF power sputter etching in a PVD chamber. This sputter etching process is configured to lessen the directionality of the sputter etch to prevent significant etching of silicon nitride layer 220 in unlanded region 215. Consequently, only the portion of silicon nitride layer 220 on the top of metal stack MS is removed, although substantial thinning of silicon nitride layer 220 occurs at the sidewalls of via hole H. Specifically, the portions of silicon nitride layer 220b within the shallower regions of via hole H, i.e., above the level of the top of metal stack MS, are substantially thinned during the sputter etch process. The sputter etch process may be configured to lessen the directionality of the etch by controlling the RF power such that the side RF power is higher than the bottom RF power. By way of example, the side RF power may be about 200 watts and the bottom RF power may be about 50 watts.

Figure 4C:
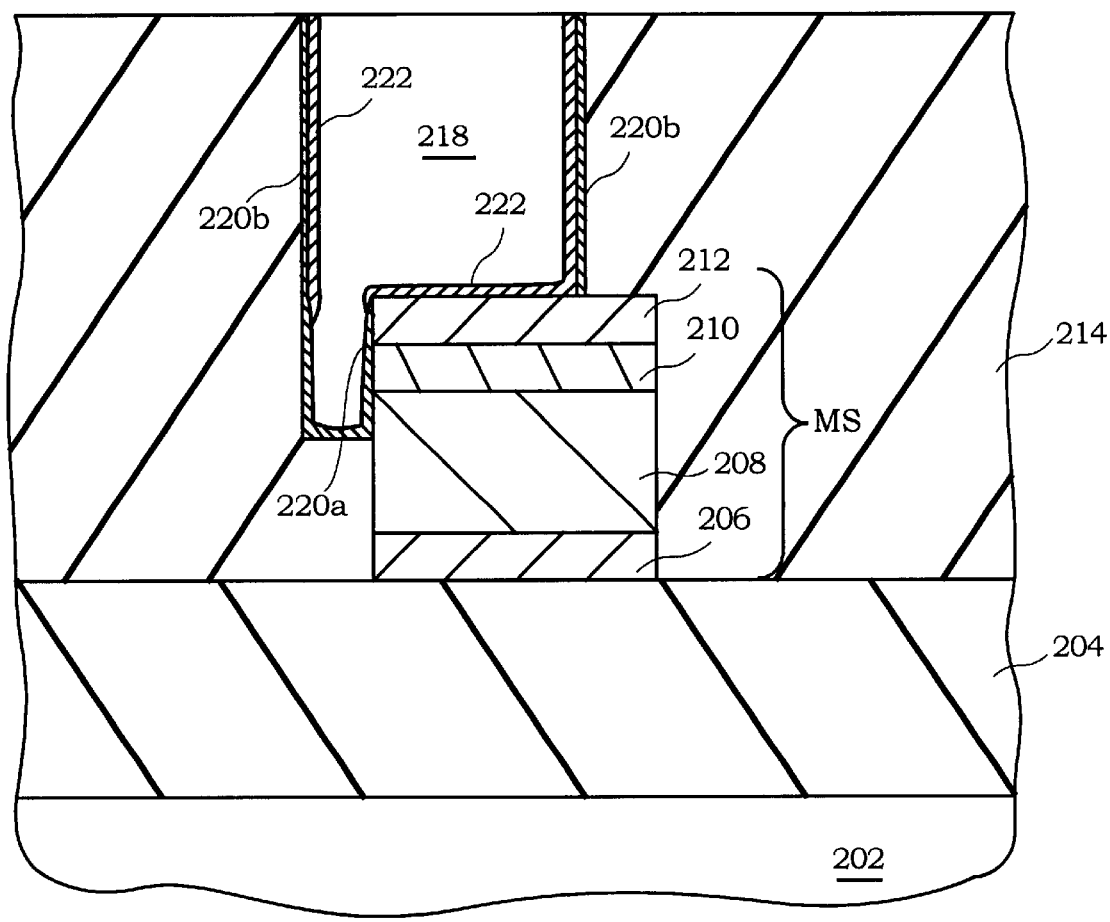
FIG. 4C is a cross-sectional view of the structure shown in FIG. 4B after a barrier layer has been deposited and the via hole has been filled with a conductive material to form a conductive via.

After the silicon nitride layer is selectively removed to define the nitrided sidewall cap layer, the via hole is filled with a conductive material to form a conductive via, as described above. FIG. 4C shows the structure of FIG. 4B after via hole H is filled with a conductive material. As shown in FIG. 4C, conductive material 218, e.g., tungsten, is disposed over metal stack MS. Conductive material 218 may be deposited using standard tungsten CVD fill processes, as described above. However, tungsten CVD does not adhere well to silicon nitride. Accordingly, glue layer 222 of, e.g., Ti/TiN, is deposited by, e.g., PVD, before the tungsten CVD fill process to facilitate filling of the via hole. As shown in FIG. 4C, glue layer 222 does not continuously cover the portion of silicon nitride layer 220a because little or no deposition of Ti/TiN occurs within the unlanded region. During the tungsten CVD fill process, sidewall cap layer 220a blocks any $WF_6$ that penetrates any portion of glue layer 222 present over the sidewalls of titanium layer 210 and conductive layer 208 and thereby protects these sidewalls from being attacked by $WF_6$.

It will be apparent to those skilled in the art that materials other than silicon nitride may be used to form the layer of dielectric material 220. For example, the dielectric may be silicon dioxide or an organic dielectric material. Suitable organic dielectric materials include, but are not limited to, amorphous carbon, polymers, and CVD/spin-on dielectrics such as hydrogen silsesquioxane (HSQ) and methyl silsesquioxane (MSQ). Those skilled in the art are familiar with suitable techniques for forming and selectively removing layers of these materials.

In the preferred embodiments of the invention described herein, the metal stack includes a layer comprised of titanium, which acts a source of free, i.e., unreacted, titanium. Those skilled in the art will appreciate that this titanium layer may be replaced by a layer of TiN that has free titanium dispersed therein or a layer of TiW that has free titanium dispersed therein. Thus, if desired, the metal stack may include such a layer of TiN or TiW formed over the conductive layer of, e.g., aluminum.

In summary, the present invention provides a sidewall cap layer that protects the sidewall of a metal stack from being attacked by $WF_6$ during a tungsten CVD fill process. The invention has been described herein in terms of several preferred embodiments in which the sidewall cap layer is a nitrided layer or a layer of dielectric material. Other embodiments of the invention will be apparent to those skilled in the art from consideration of the specification and practice of the invention. For example, the sidewall cap layer may be formed of a different material or, as mentioned above, the source of free titanium in the metal stack may be TiN or TiW. The embodiments and preferred features described above should be considered exemplary, with the invention being defined by the appended claims.

What is claimed is:

1. A semiconductor device, comprising:

a semiconductor substrate;

a metal stack disposed over said semiconductor substrate, said metal stack having a top, a bottom, and first and second opposing sidewalls, and said metal stack including a conductive layer comprised of aluminum and a layer containing free titanium disposed over said conductive layer;

a dielectric layer disposed over said metal stack, said dielectric layer having a via hole formed therein, said via hole being misaligned with said metal stack such that a portion of said via hole extends beyond said top of said metal stack and exposes at least a portion of said first sidewall of said metal stack;

a sidewall cap layer formed on said exposed portion of said first sidewall of said metal stack, said sidewall cap layer including a layer of titanium nitride and a layer of aluminum nitride, and said sidewall cap layer being configured to resist substantial penetration of $WF_6$ during chemical vapor deposition of tungsten; and a conductive material disposed in and substantially filling said via hole, said conductive material being comprised of tungsten.

2. The semiconductor device of claim 1, wherein the layer of titanium nitride has a thickness in a range from about 10 angstroms to about 200 angstroms.

3. The semiconductor device of claim 1, wherein the layer of titanium nitride has a thickness in a range from about 30 angstroms to about 100 angstroms.

4. The semiconductor device of claim 3, wherein the layer of aluminum nitride has a thickness in a range from about 20 angstroms to about 100 angstroms.

5. The semiconductor device of claim 4, wherein the semiconductor substrate is part of a silicon wafer having an oxide layer disposed thereover.

6. The semiconductor device of claim 1, wherein the layer containing free titanium is one of a layer comprised of titanium, a layer comprised of TiN having free titanium dispersed therein, or a layer comprised of TiW having free titanium dispersed therein.

7. The semiconductor device of claim 1, wherein the metal stack further includes a layer comprised of TiN disposed over said layer containing free titanium.

8. A semiconductor device, comprising:

a semiconductor substrate;

a metal stack disposed over said semiconductor substrate, said metal stack having a top, a bottom, and first and second opposing sidewalls;

a dielectric layer disposed over said metal stack, said dielectric layer having a via hole formed therein, said via hole being misaligned with said metal stack such that a portion of said via hole extends beyond said top of said metal stack and exposes at least a portion of said first sidewall of said metal stack;

a sidewall cap layer formed on said exposed portion of said first sidewall of said metal stack, said sidewall cap layer being a layer of silicon nitride having a thickness in a range from about 50 angstroms to about 300 angstroms, and said sidewall cap layer being configured to resist substantial penetration of $WF_6$ during chemical vapor deposition of tungsten; and a conductive material disposed in and substantially filling said via hole, said conductive material being comprised of tungsten.

9. The semiconductor device of claim 8, wherein the semiconductor substrate is part of a silicon wafer having an oxide layer disposed thereover.

10. A semiconductor device, comprising:

a semiconductor substrate;

a metal stack disposed over said semiconductor substrate, said metal stack having a top, a bottom, and first and second opposing sidewalls, and said metal stack including a conductive layer comprised of aluminum and a layer containing free titanium disposed over said conductive layer;

a dielectric layer disposed over said metal stack, said dielectric layer having a via hole formed therein, said via hole being misaligned with said metal stack such that a portion of said via hole extends beyond said top of said metal stack and exposes at least a portion of said first sidewall of said metal stack;

a sidewall cap layer formed on said exposed portion of said first sidewall of said metal stack, said sidewall cap layer being a layer of silicon nitride having a thickness in a range from about 50 angstroms to about 300 angstroms, and said sidewall cap layer being configured to resist substantial penetration of $WF_6$ during chemical vapor deposition of tungsten; and a conductive material disposed in and substantially filling said via hole, said conductive material being comprised of tungsten.

11. The semiconductor device of claim 10, wherein the semiconductor substrate is part of a silicon wafer having an oxide layer formed thereover.

12. A semiconductor device, comprising:

a semiconductor substrate;

a metal stack disposed over said semiconductor substrate, said metal stack having a top, a bottom, and first and second opposing sidewalls;

a dielectric layer disposed over said metal stack, said dielectric layer having a via hole formed therein, said via hole being misaligned with said metal stack such that a portion of said via hole extends beyond said top of said metal stack and exposes at least a portion of said first sidewall of said metal stack;

a sidewall cap layer formed on said exposed portion of said first sidewall of said metal stack, said sidewall cap layer being a layer of a dielectric material selected from the group consisting of amorphous carbon, polymers, hydrogen silsesquioxane (HSQ), and methyl silsesquioxane (MSQ), and said sidewall cap layer being configured to resist substantial penetration of $WF_6$ during chemical vapor deposition of tungsten; and a conductive material disposed in and substantially filling said via hole, said conductive material being comprised of tungsten.

* * * * *